(12) United States Patent
Shibuya (10) Patent No.: US 7,185,255 B2
(45) Date of Patent: Feb. 27, 2007

(54) TEST APPARATUS

(75) Inventor: Atsunori Shibuya, Tokyo (JP)

(73) Assignee: Advantest Corporation, Tokyo (JP)

( * ) Notice: Subject to any disclaimer, the term of this patent is extended or adjusted under 35 U.S.C. 154(b) by 278 days.

(21) Appl. No.: 10/858,456

(22) Filed: Jun. 1, 2004

(65) Prior Publication Data

US 2004/0221214 A1 Nov. 4, 2004

Related U.S. Application Data

(63) Continuation of application No. PCT/JP04/03651, filed on Mar. 18, 2004.

(30) Foreign Application Priority Data

Mar. 27, 2003 (JP) .............................. 2003-087049

(51) Int. Cl.
*G01R 31/28* (2006.01)
*G06F 11/00* (2006.01)

(52) U.S. Cl. ........................ 714/738; 714/30

(58) Field of Classification Search ............... None
See application file for complete search history.

(56) References Cited

U.S. PATENT DOCUMENTS

| | | | | |
|---|---|---|---|---|
| 5,525,971 A | * | 6/1996 | Flynn | 714/724 |
| 5,705,743 A | * | 1/1998 | Leonard et al. | 73/116 |
| 5,938,776 A | * | 8/1999 | Sicola et al. | 714/25 |
| 5,999,468 A | * | 12/1999 | Lawrence | 365/201 |
| 6,029,261 A | * | 2/2000 | Hartmann | 714/724 |
| 6,331,770 B1 | | 12/2001 | Sugamori | |
| 2006/0090109 A1 | * | 4/2006 | Bonnet | 714/724 |

FOREIGN PATENT DOCUMENTS

| | | |
|---|---|---|
| JP | 6-265594 | 9/1994 |
| JP | 9-184871 | 7/1997 |
| JP | 11-304880 | 11/1999 |
| WO | WO 2004/086071 | 10/2004 |

OTHER PUBLICATIONS

International Search Report dated Jul. 6, 2004 (1 page).
Patent Abstracts of Japan; Publication No. 06-265594 dated Sep. 22, 1994 (2 pages).
Patent Abstracts of Japan; Publication No. 09-184871 dated Jul. 15, 1997 (2 pages).
Patent Abstracts of Japan; Publication No. 11-304880 dated Nov. 5, 1999 (2 pages).
International Search Report dated Mar. 2, 2006 (3 pages).

* cited by examiner

*Primary Examiner*—Phung My Chung
(74) *Attorney, Agent, or Firm*—Osha Liang LLP (57) ABSTRACT

A test apparatus for testing an electronic device, includes a test module for sending and/or receiving a test signal to and/or from the electronic device, a test head including a plurality of Test Head (TH) slots for detachably holding the test module, a diagnosis module for performing diagnosis of the test module, and a coupling device including a plurality of Performance Board (PB) slots being electrically coupled to the TH slots respectively for detachably holding the diagnosis module. The diagnosis module held in one of the PB slots diagnoses the test module held in one of the TH slots being electrically coupled to one of the PB slots.

8 Claims, 6 Drawing Sheets

TEST APPARATUS

The present application is a continuation application of PCT/JP2004/003651 filed on Mar. 18, 2004 which claims priority from a Japanese patent application No. 2003-087049 filed on Mar. 27, 2003, the contents of which are incorporated herein by reference.

BACKGROUND OF THE INVENTION

1. Field of the Invention

The present invention relates to a test apparatus. More particularly, the present invention relates to a test apparatus adopting an open architecture.

2. Description of the Related Art

A conventional test apparatus performs the test of an electronic device which is mounted on a performance board for measurement being attached to a test head. In addition, when the test apparatus diagnoses a test module provided inside the test head, a performance board for diagnosis being attached to the test head performs the diagnosis of the test module, where a diagnosis circuit is formed on the performance board for diagnosis.

In such test apparatus, a variety of types of test modules are held in slots of the test head in response to the types. And on the performance board for diagnosis a plurality of diagnosis circuits are formed for diagnosis of the various types of test modules respectively, being fitted into the slots holding the various types of test modules respectively. In addition, when the performance board for diagnosis is attached to the test head holding the test modules, the test modules and the diagnosis circuits are properly coupled for each type. Since it is recognized that no prior art documents now exist, the prior art documents will not be mentioned.

In order to increase the degree of freedom for the system configuration of a test apparatus, a test apparatus adopting an open architecture is now developed. In the test apparatus adopting an open architecture the test modules of the test head can be freely positioned. Accordingly, when the diagnosis circuits perform the diagnosis of the test modules by way of the performance board for diagnosis already made and positioned, there occurs a problem that the diagnosis circuits cannot be properly coupled to the test modules in a corresponding manner.

SUMMARY OF THE INVENTION

Therefore, it is an object of the present invention to provide a test apparatus, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a test apparatus for testing an electronic device, includes a test module for sending and/or receiving a test signal to and/or from the electronic device, a test head including a plurality of TH slots for detachably holding the test module, a diagnosis module for performing diagnosis of the test module, and coupling means including a plurality of PB slots being electrically coupled to the TH slots respectively for detachably holding the diagnosis module, wherein the diagnosis module held in one of the PB slots diagnoses the test module held in one of the TH slots being electrically coupled to the one the PB slots.

The coupling means may be a performance board being detachably held by the test head.

Each of the TH slots may include a same type of connector so that the test module can be coupled to any of the TH slots, each of the PB slots may include a same type of connector so that the diagnosis module can be coupled to any of the PB slots, and the TH and PB slots may have a same type of electrically coupling pattern.

The coupling means may include a memory for correspondingly storing identification information of the test module and identification information of the diagnosis module diagnosing the test module, a test module identification information obtaining unit for obtaining the identification information of the test module from the test module, a diagnosis module identification information obtaining unit for obtaining the identification information of the diagnosis module from the diagnosis module, and an identification information comparing unit for comparing the identification information obtained by the test module identification information obtaining unit with the identification information obtained by the diagnosis module identification information obtaining unit, and checking whether the memory stores the identification information in a corresponding manner or not, and the test apparatus may continue electrically coupling the test module and the diagnosis module, if the memory correspondingly stores the identification information obtained by the test module identification information obtaining unit and the identification information obtained by the diagnosis module identification information obtaining unit, and electrically disconnect the test module and the diagnosis module, if the memory does not correspondingly store the identification information obtained by the test module identification information obtaining unit and the identification information obtained by the diagnosis module identification information obtaining unit.

The diagnosis module may include a memory for storing identification information of the test module to be diagnosed by the diagnosis module, a test module identification information obtaining unit for obtaining the identification information of the test module from the test module, and an identification information comparing unit for comparing the identification information obtained by the test module identification information obtaining unit with the identification information stored in the memory, and the coupling means, the test module or the diagnosis module may continue electrically coupling the test module and the diagnosis module, if the identification information obtained by the test module identification information obtaining unit and the identification information stored in the memory coincide, and electrically disconnect the test module and the diagnosis module, if the identification information obtained by the test module identification information obtaining unit and the identification information stored in the memory do not coincide.

The test module may include a memory for storing identification information of the diagnosis module used for diagnosis of the test module, a diagnosis module identification information obtaining unit for obtaining the identification information of the diagnosis module from the diagnosis module, and an identification information comparing unit for comparing the identification information obtained by the diagnosis module identification information obtaining unit with the identification information stored in the memory, and the coupling means, the test module or the diagnosis module may continue electrically coupling the test module and the diagnosis module, if the identification information obtained by the diagnosis module identification information obtaining unit and the identification information stored in the memory coincide, and electrically disconnect the test module and the diagnosis module, if the identification information obtained by the diagnosis module identification information obtaining unit and the identification information stored in the memory do not coincide.

The diagnosis module may be held in two of the PB slots so as to be electrically coupled to both the test modules for signal input and output, and perform diagnosis of the test modules for signal input and output.

The diagnosis module may be held in a plurality of the PB slots so as to be electrically coupled to a plurality of same type of the test modules, and perform diagnosis of the test modules.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
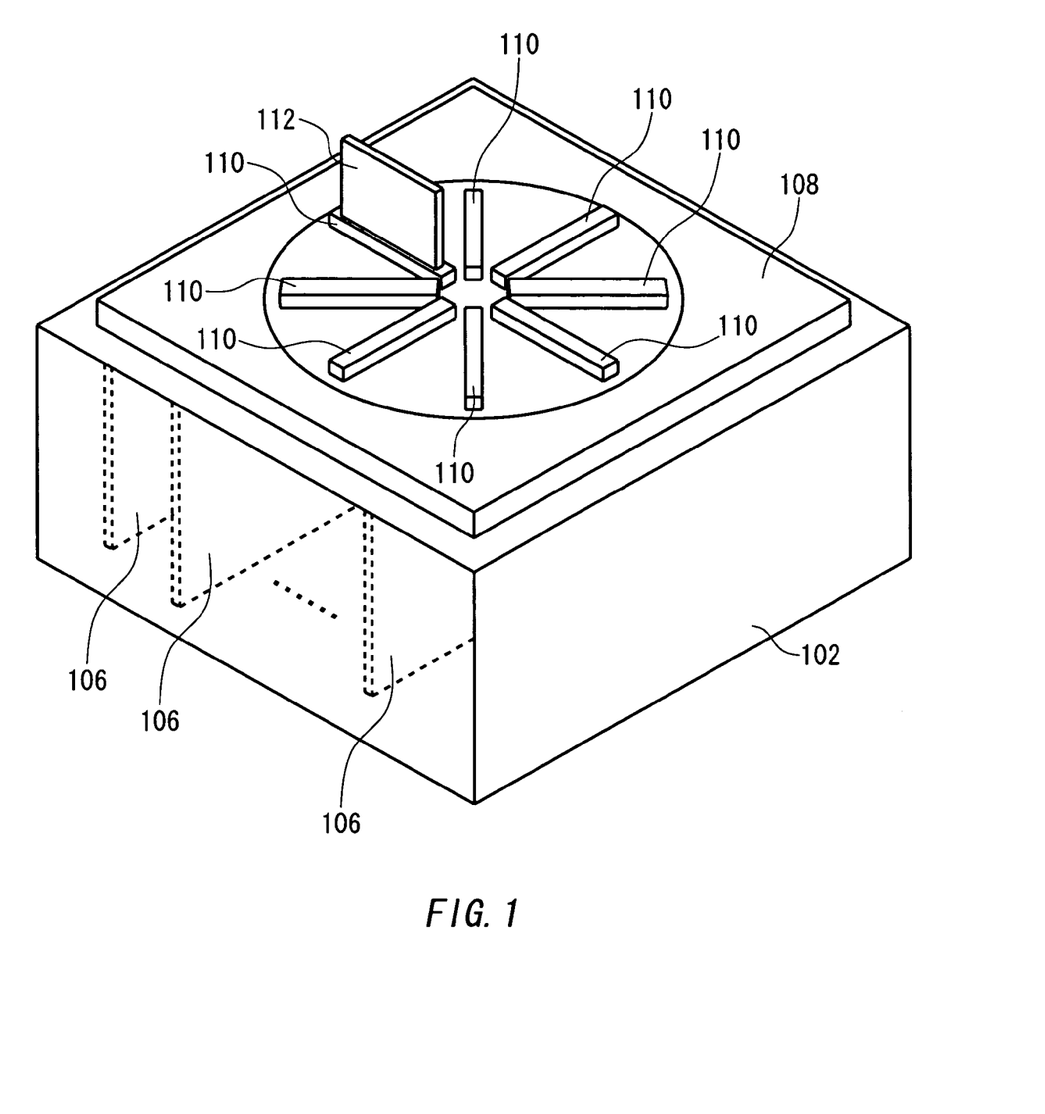
FIG. 1 shows a perspective view of a test apparatus.
Figure 2:
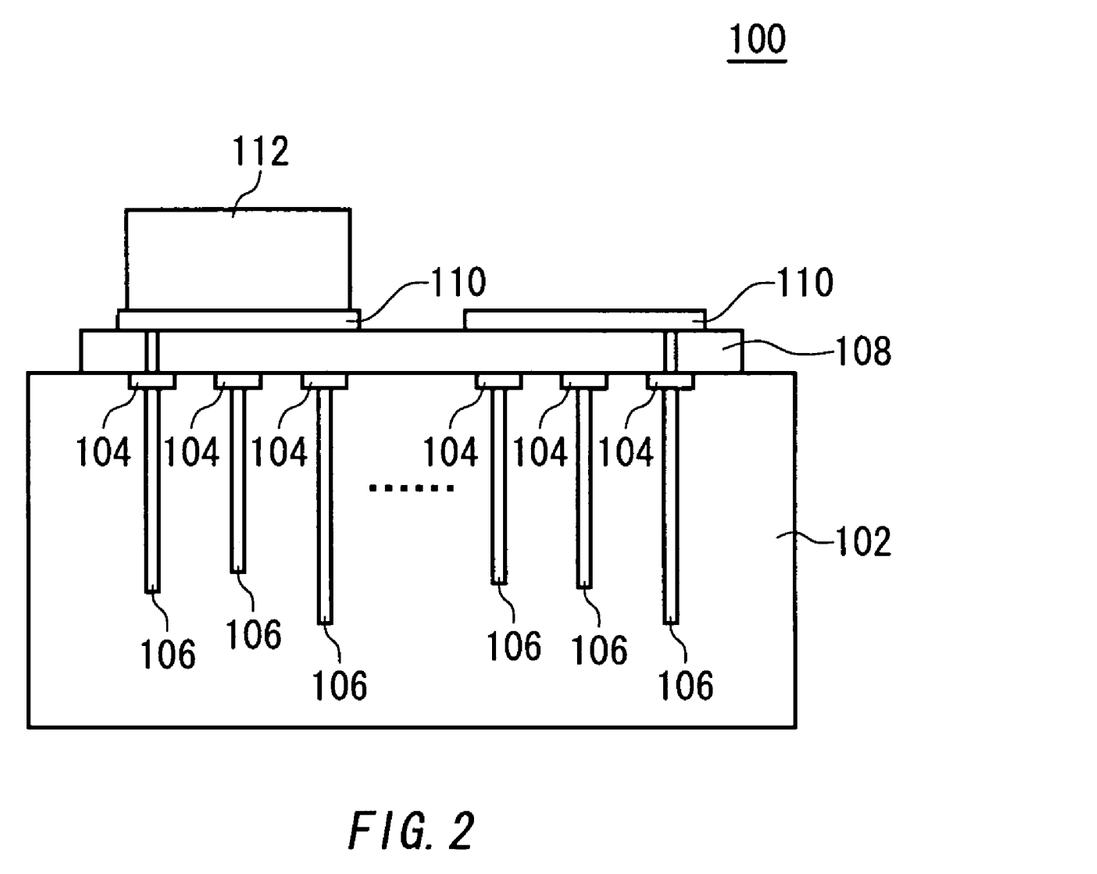
FIG. 2 shows a cross-sectional view of a test apparatus.

FIGS. 1 and 2 show an example of the configuration of a test apparatus 100 related to an exemplary embodiment of the present invention. FIG. 1 shows a perspective view of the test apparatus 100, and FIG. 2 shows a cross-sectional view of the test apparatus 100. The test apparatus 100 includes a test head 102, TH slots (Test Head slots) 104, test modules 106, a performance board 108, PB slots (Performance Board slots) 110, and diagnosis modules 112. Further, the performance board 108 is an example of coupling means of the present invention.

The test head 102 includes a plurality of TH slots 104 for detachably holding the test modules 106 for sending and/or receiving test signals with the electronic device. Each of the TH slots 104 includes a same type of connector so that the test modules 106 can be coupled to any of the TH slots 104.

The performance board 108 includes a plurality of PB slots 110 for detachably holding the diagnosis modules 112 for performing the diagnosis of the test modules 106 detachably held by the test head 102. Each of the PB slots 110 includes a same type of connector so that the diagnosis modules 112 can be coupled to any of the PB slots 110.

The TH slots 104 and the PB slots 110 have the same electrically coupling pattern. Therefore, the diagnosis modules 112 held by the PB slots 110 are electrically coupled to the test modules 106 held by the TH slots 104 being electrically coupled to the corresponding PB slots 110. And the diagnosis modules 112 send and/or receive test signals with the test modules 106 via wirings provided on the performance board 108 in order to perform diagnosis of the corresponding test modules 106.

As above, since the diagnosis modules 112 are detachable to the performance board 108, the diagnosis modules 112 can be held at the positions in response to the test modules 106 to be diagnosed. Accordingly, in the test apparatus 100 adopting an open architecture when the test modules 106 are replaced, the test modules 106 and the diagnosis modules 112 can be properly coupled by replacing the diagnosis modules 112 in response to the replaced test modules 106 to perform the diagnosis of the test modules.

Figure 3:
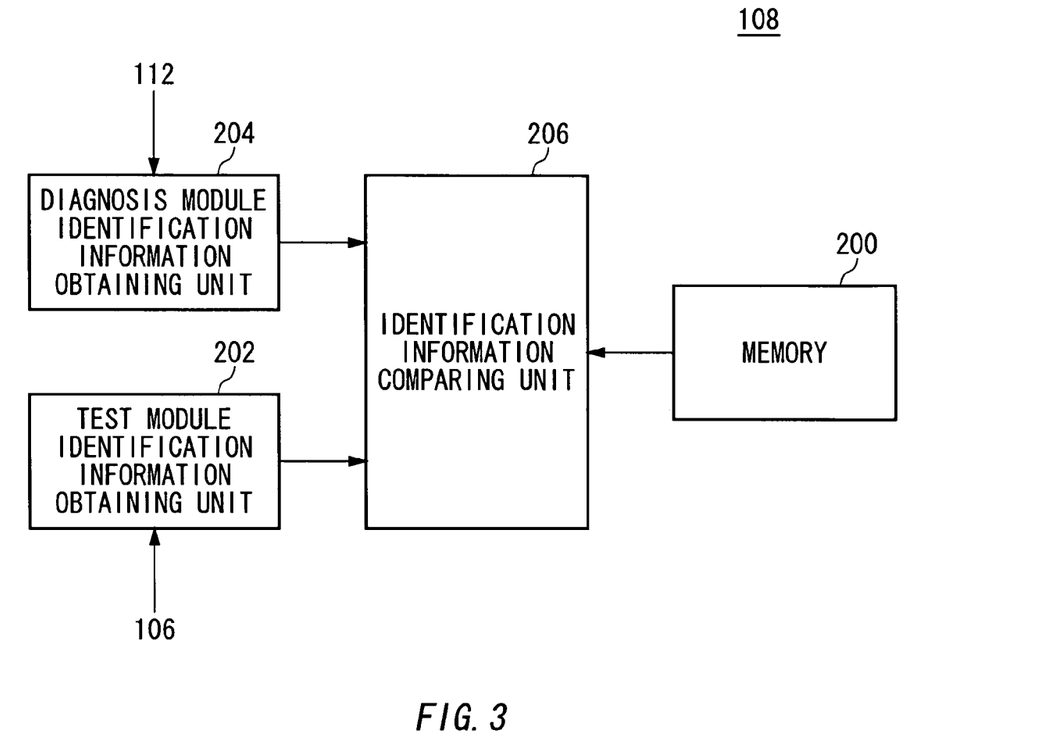
FIG. 3 shows an example of the functional configuration of a performance board.

FIG. 3 shows an example of the functional configuration of the performance board 108 of this embodiment. The performance board 108 includes a memory 200 for correspondingly storing the identification information of the test modules 106 and the identification information of the diagnosis modules 112 diagnosing the corresponding test modules 106, a test module identification information obtaining unit 202 for obtaining the identification information of the test modules 106 from the test modules 106, a diagnosis module identification information obtaining unit 204 for obtaining the identification information of the diagnosis modules 112 from the diagnosis modules 112, and an identification information comparing unit 206 for comparing the identification information obtained by the test module identification information obtaining unit 202 with the identification information obtained by the diagnosis module identification information obtaining unit 204 to check whether the memory 200 stores the identification information in a corresponding manner or not. The identification information of the test modules 106 is the information indicating the types of the test modules 106, whereas the identification information of the diagnosis modules 112 is the information indicating the types of the diagnosis modules 112.

The performance board 108 obtains the identification information from each of the test modules 106 and the diagnosis modules 112 held by the corresponding TH slots 104 and PB slots 110 respectively. In other words, the performance board 108 obtains the identification information from each of the test modules 106 and the diagnosis modules 112 being electrically coupled as it is attached to the test head 102.

The performance board 108 continues electrically coupling the test modules 106 and the diagnosis modules 112, if the memory 200 correspondingly stores the identification information obtained by the test module identification information obtaining unit 202 and the identification information obtained by the diagnosis module identification information obtaining unit 204. For example, the performance board 108 is mounted onto the test head 102, and locks the test head 102 and the performance board 108 with the test modules 106 and the diagnosis modules 112 being electrically coupled via the performance board 108. Then, the performance board 108 obtains and compares the identification information from both the test modules 106 and the diagnosis modules 112, and if the information of both sides corresponds to each other, it continues locking the test head 102 and the performance board 108. Consequently, the test modules 106 and the diagnosis modules 112 are continuously electrically coupled.

The performance board 108 discontinues electrically coupling the test modules 106 and the diagnosis modules 112, if the memory 200 does not correspondingly store the identification information obtained by the test module identification information obtaining unit 202 and the identification information obtained by the diagnosis module identification information obtaining unit 204. For example, the performance board 108 is mounted onto the test head 102, and locks the test head 102 and the performance board 108 with the test modules 106 and the diagnosis modules 112 being electrically coupled via the performance board 108. Then, the performance board 108 obtains and compares the identification information from both the test modules 106 and the diagnosis modules 112, and if the information of both sides does not correspond to each other, it discontinues locking the test head 102 and the performance board 108. Consequently, the test modules 106 and the diagnosis modules 112 are electrically disconnected.

As above, since the performance board 108 electrically couples or disconnects the test modules 106 and the diagnosis modules 112 by comparing the identification information of both sides, the diagnosis of the test modules 106 can be performed while the test modules 106 and the diagnosis modules 112 properly correspond to each other.

Figure 4:
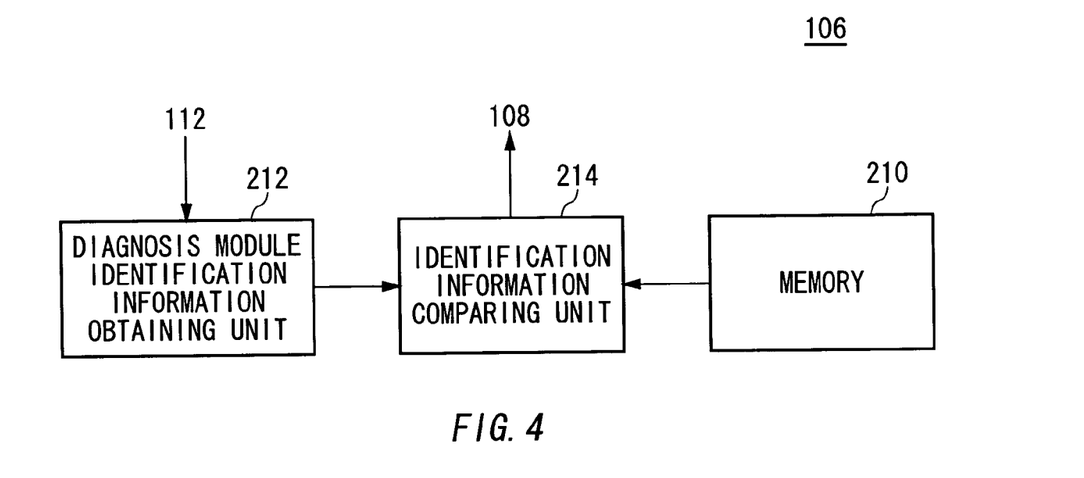
FIG. 4 shows an example of the functional configuration of a test module.

FIG. 4 shows an example of the functional configuration of the test module 106 related to this embodiment. The test module 106 includes a memory 210 for storing the identification information of the diagnosis module 112 used for the diagnosis of this test modules 106, a diagnosis module identification information obtaining unit 212 for obtaining the identification information of the diagnosis module 112 from the diagnosis module 112, and an identification information comparing unit 214 for comparing the identification information obtained by the diagnosis module identification information obtaining unit 212 with the identification information stored in the memory 210.

The performance board 108 obtains the comparison result from the identification information comparing unit 214, and if the identification information obtained by the diagnosis module identification information obtaining unit 212 and the identification information stored in the memory 210 coincide, the performance board 108 continues electrically coupling the test module 106 and the diagnosis module 112. Meanwhile, if the identification information obtained by the diagnosis module identification information obtaining unit 212 and the identification information stored in the memory 210 do not coincide, the performance board 108 electrically disconnects the test module 106 and the diagnosis module 112. As above, the test module 106 having a function of comparing the identification information may detect whether the diagnosis module 112 is suitable.

Figure 5:
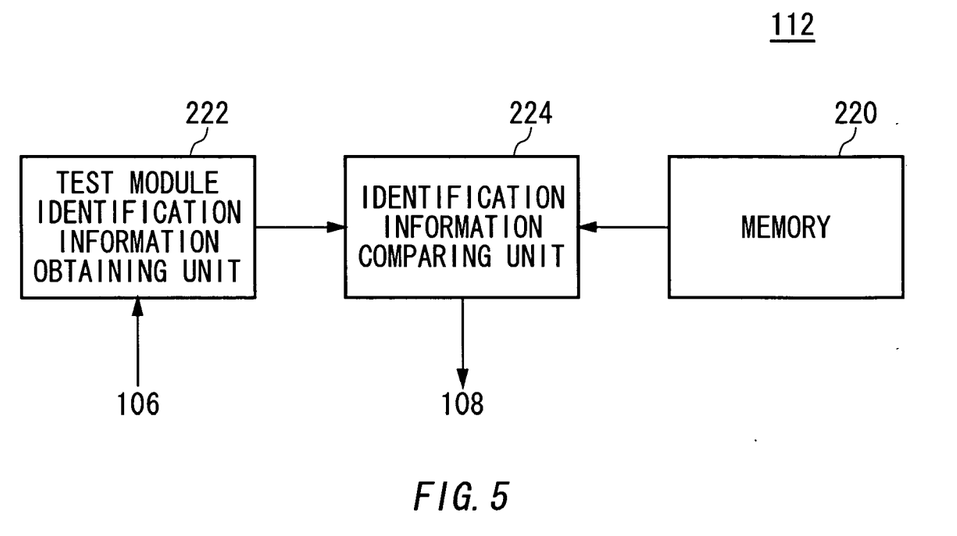
FIG. 5 shows an example of the functional configuration of a diagnosis module.

FIG. 5 shows an example of the functional configuration of the diagnosis module 112 of this embodiment. The diagnosis module 112 includes a memory 220 for storing the identification information of the test module 106 to be diagnosed by this diagnosis module 112, a test module identification information obtaining unit 222 for obtaining the identification information of the test module 106 from the test module 106, and an identification information comparing unit 224 for comparing the identification information obtained by the test module identification information obtaining unit 222 with the identification information stored in the memory 220.

The performance board 108 obtains the comparison result from the identification information comparing unit 214, and if the identification information obtained by the test module identification information obtaining unit 222 and the identification information stored in the memory 220 coincide, the performance board 108 continues electrically coupling the test modules 106 and the diagnosis modules 112. Meanwhile, if the identification information obtained by the test module identification information obtaining unit 222 and the identification information stored in the memory 220 do not coincide, the performance board 108 electrically disconnects the test module 106 and the diagnosis module 112. As above, the diagnosis module 112 having a function of comparing the identification information may detect whether the test module 106 is suitable.

Further, all of the performance board 108, the test modules 106, and the diagnosis modules 112 do not necessarily have the functional configurations described in connection with FIGS. 4 to 6, and any of the performance board 108, the test modules 106, and the diagnosis modules 112 may have the functional configurations described in connection with FIGS. 4 to 6 to judge the appropriateness of the counterpart coupled.

Further, although it is the performance board 108 that continues or discontinues electrically coupling the test modules 106 and the diagnosis modules 112 based on the comparison result of the identification information in FIGS. 3 to 5, alternatively the test modules 106 may continue or discontinue electrically coupling the test modules 106 and the diagnosis modules 112 based on the comparison result by the performance board 108 or the diagnosis modules 112 or the comparison result by the test modules 106, or the diagnosis modules 112 may continue or discontinue electrically coupling the test modules 106 and the diagnosis modules 112 based on the comparison result by the test modules 106 or the performance board 108, or based on the comparison result by the diagnosis modules 112.

Figure 6:
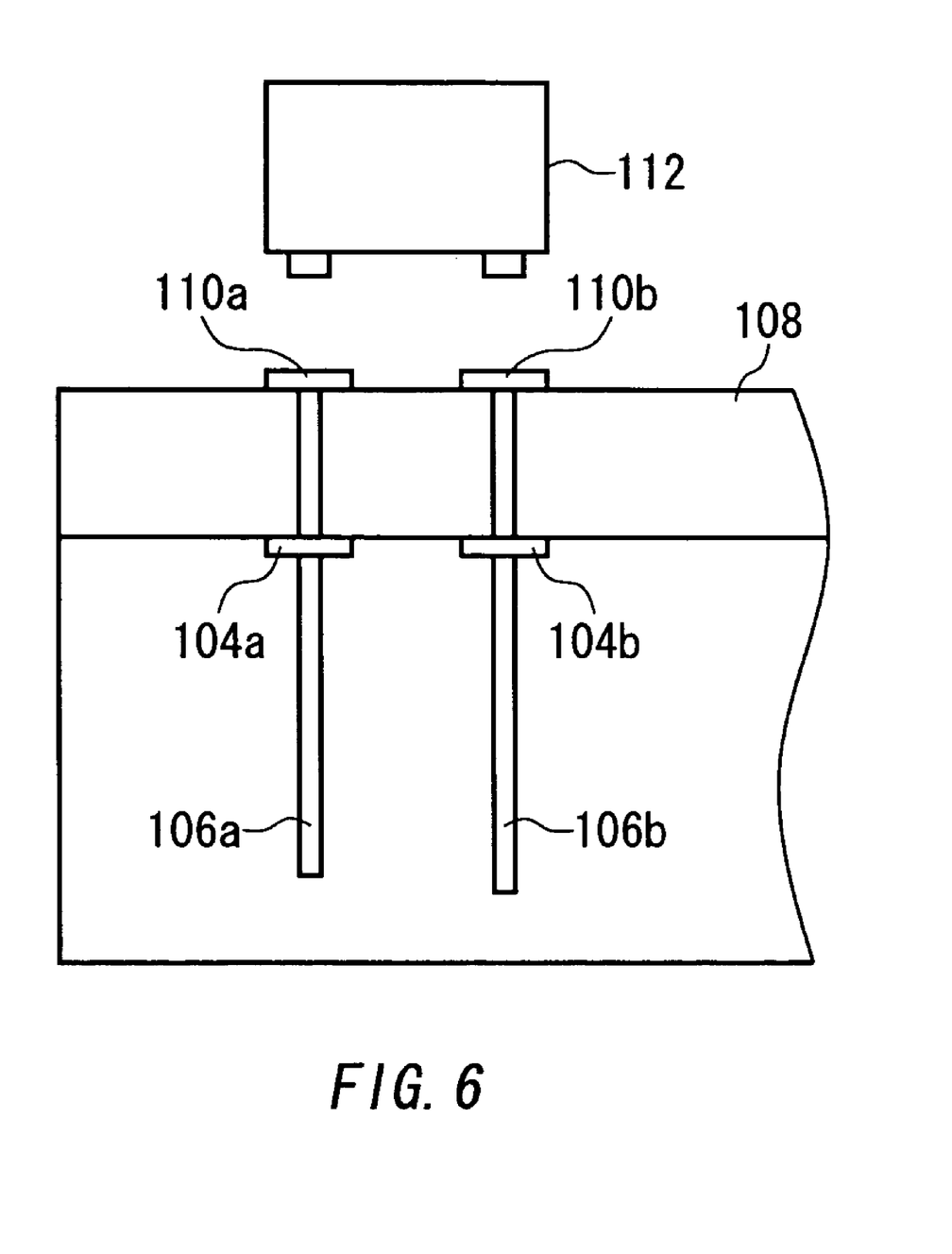
FIG. 6 shows another example of the coupling type of a test module and a diagnosis module.

FIG. 6 shows another example of the coupling type of the test module 106 and the diagnosis module 112 of this embodiment. The diagnosis module 112 may be held in a plurality of PB slots 110a and 110b in order to be electrically coupled to a plurality of the test modules 106a and 106b. The test module 106a is held in the TH slot 104a being electrically coupled to the PB slot 110a, whereas the test module 106b is held in the TH slot 104b being electrically coupled to the PB slot 110b. In addition, the test module 106a and the test module 106b are electrically coupled via the diagnosis module 112.

For example, the test module 106a is a test module for signal output of analog electrical signals, whereas the test module 106b is a test module for signal input of analog electrical signals. The diagnosis module 112 can perform the diagnosis of the test module 106a for signal output and the test modules 106b for signal input by inputting the electrical signals outputted from the test module 106a to the test module 106b.

In addition, the test modules 106a and 106b are the same type of test modules. The diagnosis modules 112 may be electrically coupled to the test modules 106a and 106b of the same type at the same time, and perform the diagnosis of the test modules 106a and 106b in a sequential or parallel manner.

Further, the diagnosis modules 112 may be electrically coupled to three or more test modules to perform the diagnosis. In addition, any of the performance board 108, the test modules 106, or the diagnosis modules 112 in this embodiment may have the functional configuration described in connection with FIG. 3, 4 or 5 to judge the appropriateness of the counterpart coupled in the same manner.

As obvious from the description above, according to the present invention, it is possible to provide a test apparatus for coupling a test module and a diagnosis module and performing diagnosis of the test module.

Although the present invention has been described by way of exemplary embodiments, it should be understood that those skilled in the art might make many changes and substitutions without departing from the spirit and the scope of the present invention which is defined only by the appended claims.

What is claimed is:

1. A test apparatus for testing an electronic device, comprising:
    a test module for sending and/or receiving a test signal to and/or from said electronic device;
    a test head comprising a plurality of TH slots for detachably holding said test module;
    a diagnosis module for performing diagnosis of said test module; and
    coupling means comprising a plurality of PB slots being electrically coupled to said TH slots respectively for detachably holding said diagnosis module,
    wherein said diagnosis module held in one of said PB slots diagnoses said test module held in one of said TH slots being electrically coupled to one of said PB slots.

2. A test apparatus as claimed in claim 1, wherein said coupling means is a performance board being detachably held by said test head.

3. A test apparatus as claimed in claim 1, wherein each of said TH slots comprises a same type of connector so that said test module can be coupled to any of said TH slots, each of said PB slots comprises a same type of connector so that said diagnosis module can be coupled to any of said PB slots, and said TH and PB slots have a same type of electrically coupling pattern.

4. A test apparatus as claimed in claim 1, wherein said coupling means comprises:
    a memory for correspondingly storing identification information of said test module and identification information of said diagnosis module diagnosing said test module;
    a test module identification information obtaining unit for obtaining said identification information of said test module from said test module;
    a diagnosis module identification information obtaining unit for obtaining said identification information of said diagnosis module from said diagnosis module; and
    an identification information comparing unit for comparing said identification information obtained by said test module identification information obtaining unit with said identification information obtained by said diagnosis module identification information obtaining unit, and checking whether said memory stores said identification information in a corresponding manner or not, and
    wherein said test apparatus continues electrically coupling said test module and said diagnosis module, if said memory correspondingly stores said identification information obtained by said test module identification information obtaining unit and said identification information obtained by said diagnosis module identification information obtaining unit, and electrically disconnects said test module and said diagnosis module, if said memory does not correspondingly store said identification information obtained by said test module identification information obtaining unit and said identification information obtained by said diagnosis module identification information obtaining unit.

5. A test apparatus as claimed in claim 1, wherein said diagnosis module comprises:
    a memory for storing identification information of said test module to be diagnosed by said diagnosis module;
    a test module identification information obtaining unit for obtaining said identification information of said test module from said test module; and
    an identification information comparing unit for comparing said identification information obtained by said test module identification information obtaining unit with said identification information stored in said memory, and
    wherein said coupling means, said test module or said diagnosis module continues electrically coupling said test module and said diagnosis module, if said identification information obtained by said test module identification information obtaining unit and said identification information stored in said memory coincide, and electrically disconnects said test module and said diagnosis module, if said identification information obtained by said test module identification information obtaining unit and said identification information stored in said memory do not coincide.

6. A test apparatus as claimed in claim 1, wherein said test module comprises:
    a memory for storing identification information of said diagnosis module used for diagnosis of said test module;
    a diagnosis module identification information obtaining unit for obtaining said identification information of said diagnosis module from said diagnosis module; and
    an identification information comparing unit for comparing said identification information obtained by said diagnosis module identification information obtaining unit with said identification information stored in said memory, and
    wherein said coupling means, said test module or said diagnosis module continues electrically coupling said test module and said diagnosis module, if said identification information obtained by said diagnosis module identification information obtaining unit and said identification information stored in said memory coincide, and electrically disconnects said test module and said diagnosis module, if said identification information obtained by said diagnosis module identification information obtaining unit and said identification information stored in said memory do not coincide.

7. A test apparatus as claimed in claim 1, wherein said diagnosis module is held in two of said PB slots so as to be electrically coupled to both said test modules for signal input and output, and performs diagnosis of said test modules for signal input and output.

8. A test apparatus as claimed in claim 1, wherein said diagnosis module is held in a plurality of said PB slots so as to be electrically coupled to a plurality of same type of said test modules, and performs diagnosis of said test modules.

* * * * *